United States Patent [19]
Kohyama

[11] Patent Number: 5,886,411
[45] Date of Patent: Mar. 23, 1999

[54] SEMICONDUCTOR DEVICE USING DUAL DAMASCENE TECHNOLOGY AND METHOD FOR MANUFACTURING THE SAME

[75] Inventor: Yusuke Kohyama, Yokosuka, Japan

[73] Assignee: Kabushiki Kaisha Toshiba, Kawasaki, Japan

[21] Appl. No.: 892,245

[22] Filed: Jul. 14, 1997

[30] Foreign Application Priority Data

Jul. 12, 1996 [JP] Japan .................................. 8-183336

[51] Int. Cl.⁶ .......................... H01L 23/48; H01L 23/52; H01L 29/40
[52] U.S. Cl. .......................... 257/774; 257/751; 257/752; 257/758; 257/763; 257/773
[58] Field of Search .................................. 257/751, 752, 257/758, 763, 764, 773–774

[56] References Cited

U.S. PATENT DOCUMENTS

| | | | |
|---|---|---|---|
| 5,592,024 | 1/1997 | Aoyama et al. | 257/751 |
| 5,677,563 | 10/1997 | Cronin et al. | 257/506 |
| 5,705,838 | 1/1998 | Jost et al. | 257/296 |
| 5,708,303 | 1/1998 | Jeng | 257/758 |

OTHER PUBLICATIONS

Carter W. Kaanta et al., "Dual Damascene: A ULSI Wiring Technology", VMIC Conference, pp. 144–152, Jun. 11–12, 1991.

D. Kenney et al., "A Buried–Plate Cell for a 64–Mb Dram", Symposium on VLSI Technology Digest of Technical Papers, pp. 14–15, Dec. 1992.

M. Fukumoto et al., "Stacked capacitor cell technology for 16M DRAM using double self–aligned contacts", ESSDERC 90, Nottingham, Session 6A2, pp. 461–464, Sep. 1990.

*Primary Examiner*—Mahshid Saadat
*Assistant Examiner*—Allan R. Wilson
*Attorney, Agent, or Firm*—Finnegan, Henderson, Farabow, Garrett & Dunner, L.L.P.

[57] ABSTRACT

Trenches are formed in a silicon oxide film, a barrier metal film and tungsten film are formed, and the surface portion is polished to make the surface flat and form interconnection layers of the tungsten film in the trenches. Then, the tungsten film and barrier film are etched to form a stepped portions, a silicon nitride film is formed to fill the stepped portions, and the silicon nitride film is polished to make the surface flat. After this, the silicon oxide film is etched by use of a mask pattern to form contact holes in a self-aligned manner. Then, a silicon nitride film is formed and the surface portions is etched back to form side walls on the side walls of the contact holes and a barrier metal film and tungsten film are sequentially formed to fill the contact holes, then the tungsten film and barrier metal film are polished until the silicon oxide film and silicon nitride film are exposed, and as a result, the surface is made flat.

12 Claims, 10 Drawing Sheets

SEMICONDUCTOR DEVICE USING DUAL DAMASCENE TECHNOLOGY AND METHOD FOR MANUFACTURING THE SAME

BACKGROUND OF THE INVENTION

This invention relates to the cell structure of a dynamic RAM (DRAM), for example, and more particularly to an STC (Stacked Capacitor) type semiconductor memory device in which memory cell capacitors are formed in self-alignment with bit lines above the bit lines and a method for manufacturing the same.

Recently, semiconductor memory devices, particularly DRAMs are miniaturized, the resolution in the lithography technology is markedly enhanced and the line width and the interval between the lines are progressively reduced. However, the improvement of the alignment technique cannot catch up with the development of the resolution and it becomes more important to take effective measures for preventing occurrence of alignment error.

As one of the measures for preventing occurrence of alignment error, for example, there is provided a technique disclosed in "C. W. Kaanta et al. 'Dual Damascene : A ULSI Wiring Technology', VMIC, pp. 144 to 152, 1991" in the technology for forming contact holes and wires in a borderless manner. Further, as a device obtained by applying this technique to bit line contacts and bit lines, there is provided a memory cell described in "D. Kenny et al. 'A Buried-Plate Trench Cell for 64-Mb DRAM', VLSI Tech. Symp. pp. 14 to 15, 1992".

Further, in a cell using an STC capacitor, as the technique for forming memory cell capacitors in self-alignment with bit lines, for example, there is proposed a memory cell described in "M. Fukumoto et al, 'Stacked capacitor cell technology for 16M DRAM using double self-aligned contacts', ESSDERC 90, pp. 461 to 464, 1990".

The Dual Damascene technology is explained with reference to FIG. 1.

First, as shown in FIG. 1A, an inter-level insulating film 102 whose upper surface portion is planarized is formed on a lower-level interconnection 101. Then, a first resist 104 having a contact hole pattern 103 and a second resist 106 having an upper-level interconnection pattern 105 are formed on the upper-level insulating film 102. Next, as shown in FIG. 1B, the inter-level insulating film 102 is selectively etched to form a contact hole 107 with the resists 104, 106 used as a mask. After this, as shown in FIG. 1C, an exposed part of the first resist 104 is removed to form an upper-level interconnection pattern 108. At this time, the surface portion of the second resist 106 is also removed by an amount corresponding to the film thickness of the first resist 104. Then, as shown in FIG. 1D, the inter-level insulating film 102 is selectively etched to form a contact hole 109 and an upper-level interconnection pattern 110. Next, as shown in FIG. 1E, a metal film 111 is deposited on the semiconductor structure to completely fill the contact hole 109 and the upper-level interconnection pattern 110. Then, as shown in FIG. 1F, the metal film 111 is etched back by use of a CMP (Chemical Mechanical Polishing) method to form an upper-level interconnection 112 and make the upper surface of the structure flat.

When the Dual Damascene technology is applied to a cell using an STC type capacitor, there occurs a problem that the memory capacitor cannot be formed in self-alignment with the bit line.

That is, in order to form a memory capacitor, it is necessary to form a self-aligned contact hole in the inter-level insulating film to reach the surface of a source or drain diffusion layer formed on the semiconductor substrate. However, since the surface of the upper-level interconnection 112 is exposed, the upper-level interconnection 112 will be exposed when the inter-level insulating film 102 is etched to form the contact hole. In order to solve the above problem, it is necessary to previously form an insulating film 113 used as an etching mask on the upper-level interconnection and then form a contact hole 114 as shown in FIG. 2. However, in this case, it becomes impossible to form the contact hole in a self-alignment manner. Therefore, the contact hole must be formed at a preset distance from the upper-level interconnection 112 to provide a sufficient alignment tolerance, and as a result, the interval between the interconnections becomes large, thereby making it difficult to attain fine patterning.

BRIEF SUMMARY OF THE INVENTION

Accordingly, an object of this invention is to provide a semiconductor device having contact holes formed in self-alignment with bit lines and a method for manufacturing the same.

According to one aspect of this invention, there is provided a method for manufacturing a semiconductor device, comprising the steps of forming a first insulating film on a semiconductor substrate; forming trenches in the first insulating film; filling conductive films in the trenches; etching the conductive films by a preset thickness in the depth direction thereof to form stepped portions which have a difference in level with respect to the first insulating film; and filling second insulating films in the stepped portions.

According to another aspect of this invention, there is provided a method for manufacturing a semiconductor device, comprising the steps of forming a first insulating film on a semiconductor substrate; forming trenches in the first insulating film; filling conductive films in the trenches; etching the conductive films by a preset thickness in the depth direction thereof to form stepped portions which have a difference in level with respect to the first insulating film; filling second insulating films in the stepped portions; and etching the first insulating film by the selective etching process using the second insulating films as a mask to form contact holes adjacent to the trenches.

According to still another aspect of this invention, there is provided a method for manufacturing a semiconductor device, comprising the steps of forming a first insulating film on a semiconductor substrate; forming trenches in the first insulating film; forming conductive films on the inner walls of the trenches; filling second conductive films in the trenches; etching the second conductive films by a preset thickness in the depth direction thereof and etching the first conductive films by an amount larger than the etching amount of the second conductive film to form stepped portions which have a difference in level with respect to the first insulating film; and filling second insulating films in the stepped portions.

According to another aspect of this invention, there is provided a method for manufacturing a semiconductor device, comprising the steps of forming a first insulating film on a semiconductor substrate; forming trenches in the first insulating film; filling conductive films in the trenches to form bit lines; etching the conductive films by a preset thickness in the depth direction thereof to form stepped portions which have a difference in level with respect to the first insulating film; filling second insulating films in the stepped portions; and etching the first insulating film by the selective etching process using the second insulating films as a mask to form storage node contact holes adjacent to the trenches.

According to another aspect of this invention, there is provided a method for manufacturing a semiconductor device, comprising the steps of forming an element isolation insulating film on a semiconductor substrate; forming MOSFETs by forming gate electrodes over the semiconductor substrate with gate insulating films disposed therebetween and selectively doping impurity into the semiconductor substrate to form source and drain diffusion regions; forming a first insulating film to cover the MOSFETs; forming bit line contact holes in the first insulating film; forming trenches in which bit lines are formed in the later step in the first insulating film; filling conductive films in the trenches and bit line contact holes to form bit lines which are each electrically connected to one of the source and drain diffusion regions of a corresponding one of the MOSFETs; etching the conductive films by a preset thickness in the depth direction thereof to form stepped portions which have a difference in level with respect to the first insulating film; filling second insulating films in the stepped portions; etching the first insulating film by the selective etching process using the second insulating films as a mask to form storage node contact holes adjacent to the bit lines; forming spacers of a third insulating film on the side walls of the storage node contact holes; filling conductive films in the storage node contact holes; and sequentially forming storage electrodes, capacitor insulating films and plate electrodes to form capacitors which are each electrically connected to the other of the source and drain diffusion regions of a corresponding one of the MOSFETs.

According to another aspect of this invention, there is provided a semiconductor device comprising a first insulating film formed on a semiconductor substrate; trenches formed in the first insulating film; first conductive films formed on the inner surfaces of the trenches to such a thickness that the trenches are not completely filled; second conductive films formed on the first conductive films to such a thickness that the trenches are not completely filled; and second insulating films formed on the first and second conductive films to completely fill the trenches.

According to still another aspect of this invention, there is provided a semiconductor device comprising a first insulating film formed on a semiconductor substrate; trenches formed in the first insulating film; first conductive films formed on the inner surfaces of the trenches except the upper portions thereof to such a thickness that the trenches are not completely filled; second conductive films formed on the first conductive films to such a thickness that the upper surface thereof is set at a higher position than the upper surface of the conductive film formed on the side wall of the trench; and second insulating films formed to completely fill the trenches.

According to another aspect of this invention, there is provided a semiconductor device comprising a first insulating film formed on a semiconductor substrate; first and second trenches separately formed in the first insulating film; contact holes formed in an area of the first insulating film disposed between the first and second trenches; first spacers formed of a second insulating film on the side walls of the first and second trenches; first conductive films formed on the inner surfaces of the first and second trenches to such a thickness that the trenches are not completely filled; second conductive films formed on the first conductive films to completely fill the trenches; second spacers formed of a third insulating film on the side walls of the contact holes; third conductive films formed on the inner surfaces of the contact holes to such a thickness that the contact holes are not completely filled; and fourth conductive films formed on the third conductive films to completely fill the contact holes.

According to another aspect of this invention, there is provided a semiconductor device comprising an element isolation insulating film formed on a semiconductor substrate; MOSFETs having gate electrodes formed over the semiconductor substrate with gate insulating films disposed therebetween and source and drain diffusion regions formed in the semiconductor substrate; a first insulating film formed to cover the MOSFETs; trenches for forming bit lines and bit line contact holes formed in the first insulating film; bit lines which are formed of a first conductive film formed to partly fill the trenches and which are each electrically connected to one of the source and drain diffusion regions of a corresponding one of the MOSFETs; second insulating films formed to completely fill the trenches; storage node contact holes formed in the first insulating film in positions adjacent to the bit lines; spacers formed of a third insulating film on the side walls of the storage node contact holes; second conductive films formed to fill the storage node contact holes; and capacitors which include storage electrodes, capacitor insulating films and plate electrodes and which are each electrically connected to the other of the source and drain diffusion regions of a corresponding one of the MOSFETs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described an embodiment of this invention with reference to the accompanying drawings.

FIGS. 3A to 3E show a manufacturing method in the order of steps for manufacturing a semiconductor device according to a first embodiment of this invention.

Figure 1A:
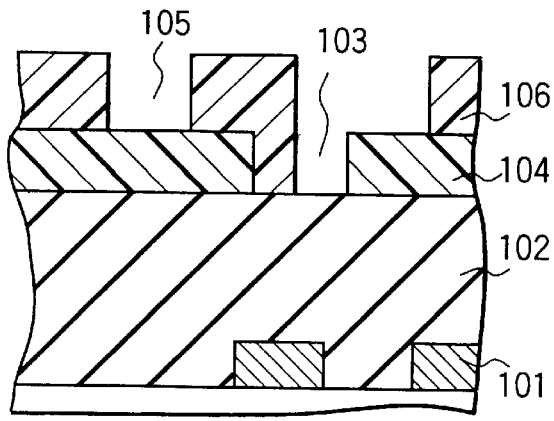
FIGS. 1A to 1F are cross sectional views for illustrating a conventional method in the order of steps for manufacturing a semiconductor device.
Figure 1B:
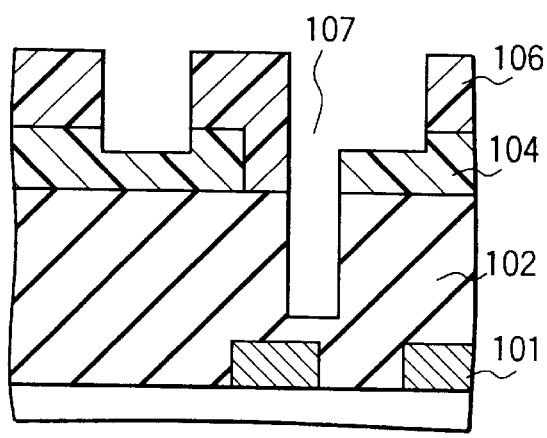
Figure 1C:
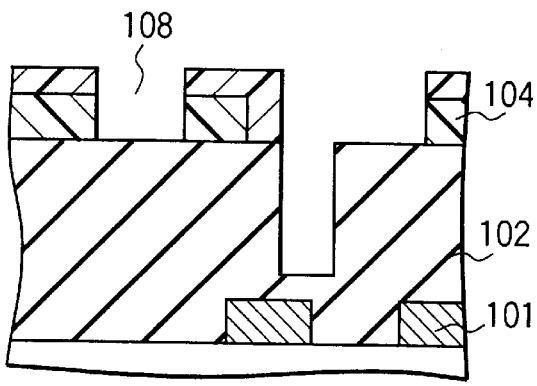
Figure 1D:
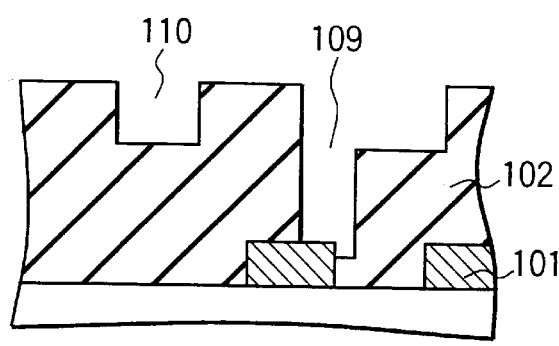
Figure 1E:
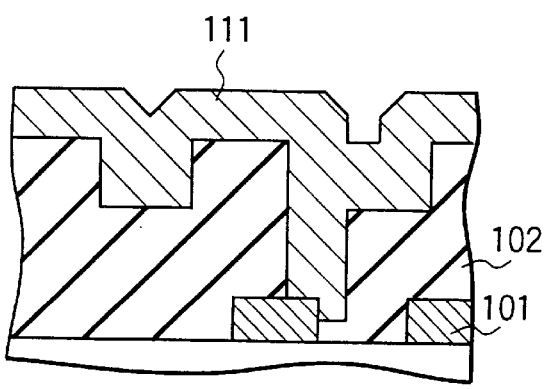
Figure 1F:
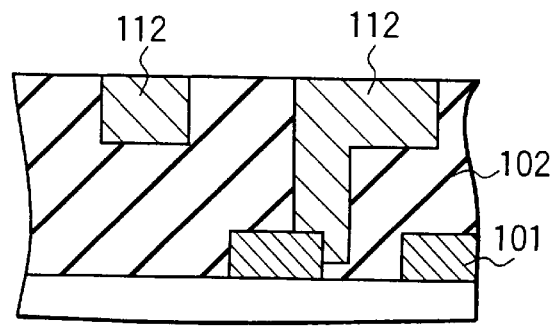
Figure 2:
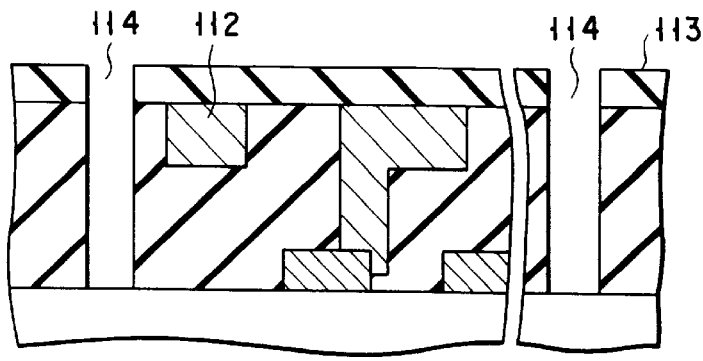
FIG. 2 is a cross sectional view showing a step following the step of FIG. 1F.
Figure 3A:
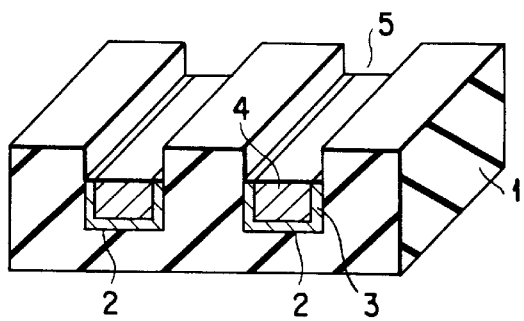
FIGS. 3A to 3E are cross sectional views for illustrating a manufacturing method in the order of steps for manufacturing a semiconductor device according to a first embodiment of this invention.

First, as shown in FIG. 3A, a silicon oxide film 1 is formed on a semiconductor substrate (not shown) and a plurality of parallel trenches 2 are formed in the silicon oxide film 1 by use of the known lithography technology and RIE (Reactive Ion Etching) method. Next, a barrier metal film 3 such as a TiN or WN film is deposited on the entire surface to such a thickness as not to completely fill the trenches 2 by the sputtering method and then a refractory metal film, for example, tungsten film 4 is formed on the entire surface to completely fill the trenches 2 by use of the CVD (Chemical Vapor Deposition) method. After this, the tungsten film 4 and barrier metal film 3 are polished by use of the CMP method until the silicon oxide film 1 is exposed so that the surface of the structure can be made flat and interconnection layers of the tungsten film 4 can be formed. Further, the tungsten film 4 and barrier metal film 3 are etched to some extent to form stepped portions (depressed portions) 5 by use of the RIE method.

Figure 3B:
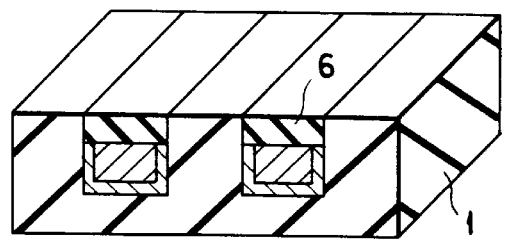

Next, as shown in FIG. 3B, a silicon nitride film 6 is formed on the entire surface by the CVD method to fill the stepped portions 5 and then the silicon nitride film 6 is polished by use of the CMP method to make the surface of the structure flat.

In the process up to the above step, a plurality of trenches 2 are formed in the silicon oxide film 1 formed on the semiconductor substrate, the barrier metal films 3 having such a thickness as not to completely fill the trenches 2 are formed on the inner surfaces of the trenches 2, the tungsten films 4 are formed on the barrier metal films 3 to partly fill the trenches 2 and the nitride films 6 are formed on the tungsten films 4 to completely fill the trenches 2.

Further, in the process up to the above step, an insulating film (silicon nitride film 6) required for forming a self-aligned contact which cannot be attained in the conventional Damascene technology can be formed directly on the interconnection layer.

Figure 3C:
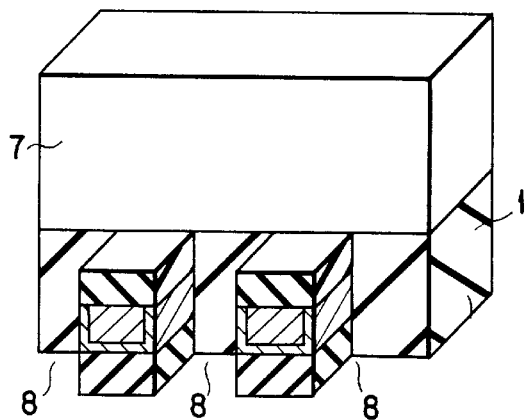

Next, as shown in FIG. 3C, a photoresist 7 is formed by use of a line/space pattern intersecting the trenches 2 at right angles, and the silicon oxide film 1 is etched by use of the RIE method under a condition that the selective etching ratio for the photoresist 7 and silicon nitride film 6 is set high so as to form a plurality of contact holes 8 in a self-alignment manner.

Figure 3D:
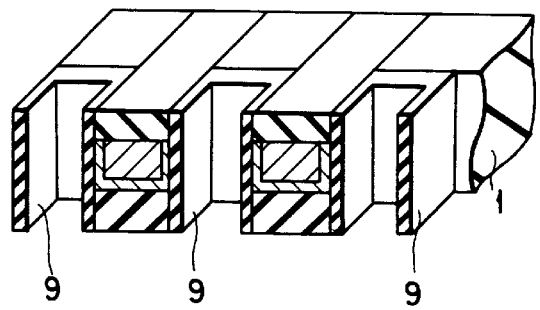

Then, after the photoresist 7 is removed, a silicon nitride film is formed on the entire surface and the entire surface portion is etched back by use of the RIE method to form side walls 9 of the silicon nitride film on the side walls of the contact holes 8 as shown in FIG. 3D.

Figure 3E:
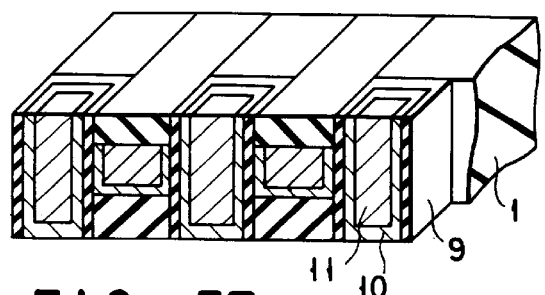

Next, as shown in FIG. 3E, a barrier metal film 10 and tungsten film 11 are sequentially deposited to fill the respective contact holes 8. Then, the tungsten film 11 and barrier metal film 10 are polished by use of the CMP method until the silicon oxide film 1 and the silicon nitride film 6 are exposed and thus the upper surface of the structure is made flat.

With the above method, contacts adjacent to the Damascene interconnections can be formed in self-alignment with the Damascene interconnections (tungsten films 4). Therefore, in a semiconductor device using the Damascene interconnections, when contacts are formed between the Damascene interconnections, it is unnecessary to provide extra alignment tolerance for forming the contacts so that the interval between the Damascene interconnections can be made sufficiently small, thereby making it possible to reduce the chip size at the time of integration.

In the semiconductor device thus formed, interconnection layers formed of the tungsten films 4 are used as bit lines of memory cells and contacts formed adjacent to the bit lines are used as the storage node contacts of the memory cells.

Next, a manufacturing method for manufacturing a semiconductor device according to a second embodiment of this invention is explained with reference to FIGS. 4A to 4E.

In the manufacturing method for manufacturing the semiconductor device according to the first embodiment, the process for etching the silicon oxide film 1 is effected under a condition that the selective etching ratio for the silicon nitride film 6 is set high when the silicon oxide film 1 is etched to form the contact holes 8. However, since the selective etching ratio is a finite value, the silicon nitride film 6 itself is slightly etched in the etching process. At this time, the silicon nitride film 6 which is a spacer is etched at a certain rate by a fluctuation in the etching condition and a fluctuation in the film thickness, and as a result, a short circuit occurs in some cases. By investigating the process of occurrence of the short circuit in detail, it is understood that the short circuit occurs in the shoulder portion of the interconnection layer. Therefore, in the semiconductor device according to the second embodiment, a measure is taken to prevent occurrence of the short circuit in the shoulder portion of the interconnection layer.

Figure 4A:
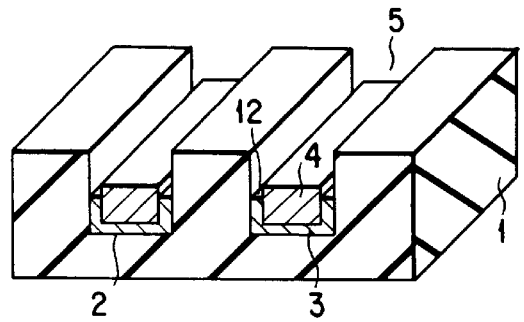
FIGS. 4A to 4E are cross sectional views for illustrating a manufacturing method in the order of steps for manufacturing a semiconductor device according to a second embodiment of this invention.

That is, like the method in the first embodiment, a silicon oxide film 1 is formed on a semiconductor substrate (not shown) as shown in FIG. 4A. After this, a plurality of parallel trenches 2 are formed in the silicon oxide film 1 by use of the known lithography technology and RIE method, then, a barrier metal film 3 is deposited on the entire surface to such a thickness as not to completely fill the trenches 2 by the sputtering method, and a refractory metal film, for example, tungsten film 4 is formed on the entire surface to completely fill the trenches 2 by use of the CVD method. After this, the tungsten film 4 and barrier metal film 3 are selectively etched by the RIE method using $Cl_2$-series gas to form stepped portions 5. At this time, since the etching rate of a titanium compound (TiN) for the $Cl_2$-series gas is higher than that of tungsten, shallow grooves 12 whose depth corresponds to the film thickness of the barrier metal film 3 are formed on both sides of the upper portion of the interconnection layer.

Figure 4B:
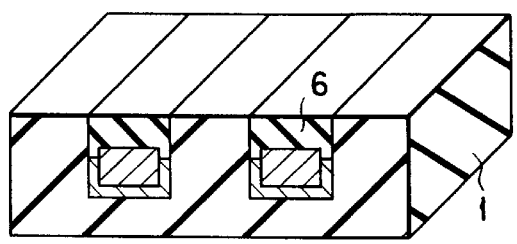
Figure 4C:
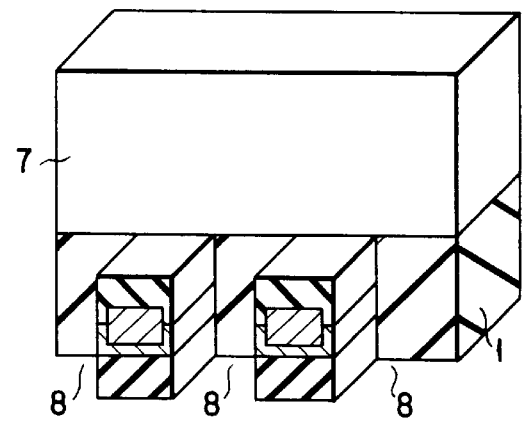
Figure 4D:
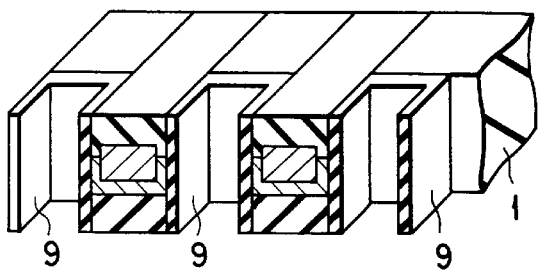
Figure 4E:
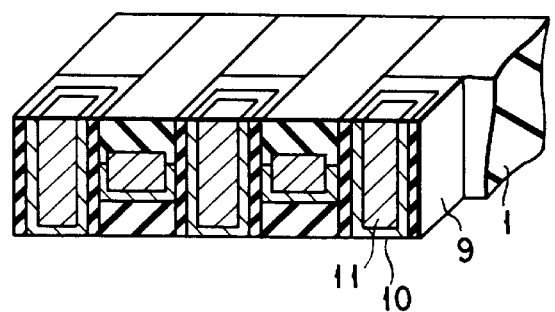

After this, the process is effected in the same manner as in the first embodiment. That is, as shown in FIG. 4B, a silicon nitride film 6 is formed on the entire surface by use of the CVD method to fill the stepped portions 5, then the silicon nitride film 6 is polished by use of the CMP method to make the surface of the structure flat. Further, as shown in FIG. 4C, a photoresist 7 is formed by use of a line/space pattern intersecting the trenches 2 at right angles, and the silicon oxide film 1 is etched by use of the RIE method so as to form contact holes 8 in a self-alignment manner. Then, after the photoresist 7 is removed, a silicon nitride film is formed on the entire surface and the entire surface portion is etched back by use of the RIE method to form side walls 9 of the silicon nitride film on the side walls of the contact holes 8 as shown in FIG. 4D. Next, as shown in FIG. 4E, a barrier metal film 10 and tungsten film 11 are sequentially deposited to fill the contact holes 8. Then, the tungsten film 11 and barrier metal film 10 are polished to make the surface of the structure flat by use of the CMP method until the silicon oxide film 1 and the silicon nitride film 6 are exposed.

With the above method, since the silicon nitride film on the shoulder portion of the interconnection layer can be made thicker than the side wall portion of the trench 2, the probability that the short circuit described before will occur can be markedly reduced, thereby making it possible to manufacture a semiconductor device of high reliability with high manufacturing yield.

FIGS. 5A to 5F show a manufacturing method in the order of steps for manufacturing a semiconductor device according to a third embodiment of this invention.

Figure 5A:
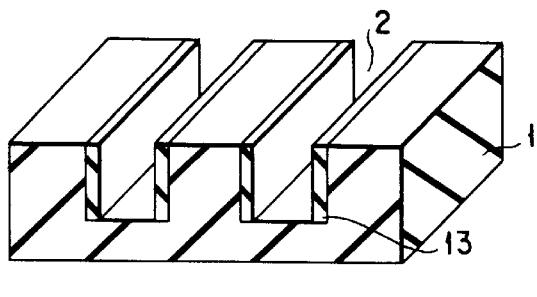
FIGS. 5A to 5F are cross sectional views for illustrating a manufacturing method in the order of steps for manufacturing a semiconductor device according to a third embodiment of this invention.
Figure 5B:
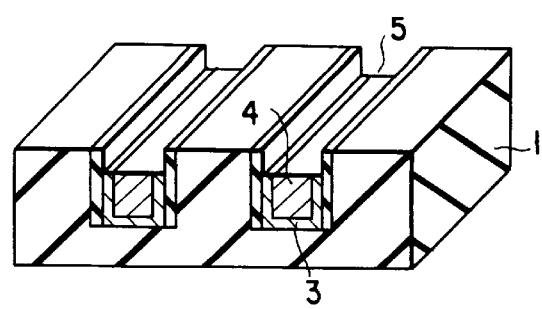

First, as shown in FIG. 5A, a silicon oxide film 1 is formed on a semiconductor substrate (not shown) and a plurality of parallel trenches 2 are formed in the silicon oxide film 1 by use of the known lithography technology and RIE (Reactive Ion Etching) method. Next, a silicon nitride film is deposited on the entire surface to such a thickness as not to completely fill the trenches 2, and then the entire surface portion is etched back to form side walls of the silicon nitride film on the side walls of the trenches 2.

Figure 5C:
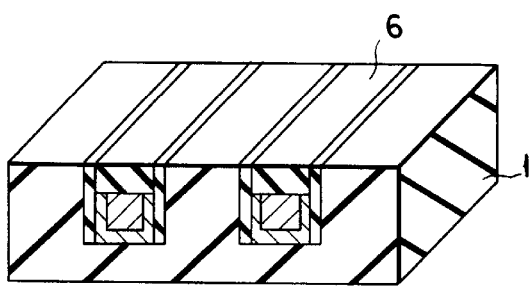

Then, a barrier metal film 3 such as a TiN or WN film is deposited on the entire surface to such a thickness as not to completely fill the trenches 2 by the sputtering method and then a refractory metal film, for example, tungsten film 4 is formed on the entire surface to completely fill the trenches 2 by use of the CVD. After this, the tungsten film 4 and barrier metal film 3 are polished by use of the CMP method until the silicon oxide film 1 is exposed so that the surface of the structure can be made flat and interconnection layers of the tungsten film 4 can be formed. Further, the tungsten film 4 and barrier metal film 3 are etched to some extent to form stepped portions 5 by use of the RIE method. At this time, like the method of the second embodiment, the etching process may be effected under a condition that the etching rate of the barrier metal film 3 is set higher than that of the tungsten film 4 so as to form shallow grooves whose depth corresponds to the film thickness of the barrier metal film 3 are formed on both sides of the upper portion of the interconnection layer. Next, as shown in FIG. 5C, a silicon nitride film 6 is formed on the entire surface by use of the CVD method to fill the stepped portions 5 and then the silicon nitride film 6 is polished by use of the CMP method to make the surface of the structure flat.

In the process up to the above step, a plurality of trenches 2 are formed in the silicon oxide film 1 which is formed on the semiconductor substrate, the side walls 13 of the silicon nitride film are formed on the side walls of the trenches 2, the barrier metal films 3 having such a thickness as not to completely fill the trenches 2 are formed on the inner surfaces of the trenches 2, the tungsten films 4 are formed on the barrier metal films 3 to partly fill the trenches 2 and the nitride films 6 are formed on the tungsten films 4 to completely fill the trenches 2.

Further, like the case of the first embodiment, in the process up to the above step, an insulating film (silicon nitride film 6) required for forming a self-aligned contact which cannot be attained in the conventional Damascene technology can be formed on the interconnection layer.

Figure 5D:
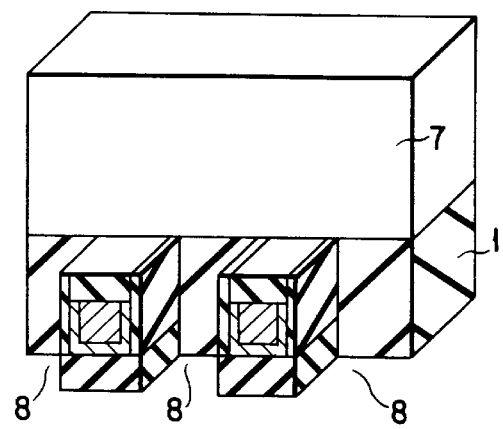

Next, as shown in FIG. 5D, a photoresist 7 is formed by use of a line/space pattern intersecting the trenches 2 at right angles, and the silicon oxide film 1 is etched by use of the RIE method under a condition that the selective etching ratio for the photoresist 7 and silicon nitride film 6 is set high so as to form a plurality of contact holes 8 in a self-alignment manner.

Figure 5E:
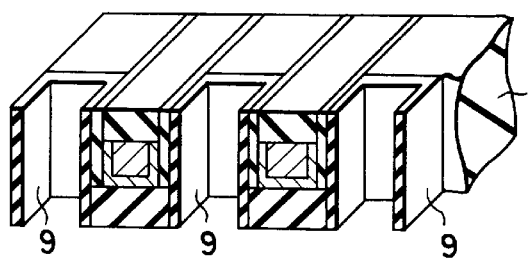

Then, after the photoresist 7 is removed, a silicon nitride film is formed on the entire surface and the entire surface portion is etched back by use of the RIE method to form side walls 9 of the silicon nitride film on the side walls of the contact holes 8 as shown in FIG. 5E. At the time of formation of the silicon nitride film which is used to form the side walls 9, in the method of the first embodiment, the silicon nitride film is formed in contact with the barrier metal film 3 formed in the trench. It is generally known that the film quality of the silicon nitride film formed on a metal film tends to be easily deteriorated in comparison with the film quality of the silicon nitride film formed on an insulating film. In this embodiment, since the side walls 13 formed of the silicon nitride film are previously formed on the side walls of the trenches, the side walls 9 can be formed without causing the above deterioration of the film quality. Of course, at the time of formation of the side walls 13, they are formed on the insulating film (silicon oxide film 1) and the above deterioration will not occur.

Figure 5F:
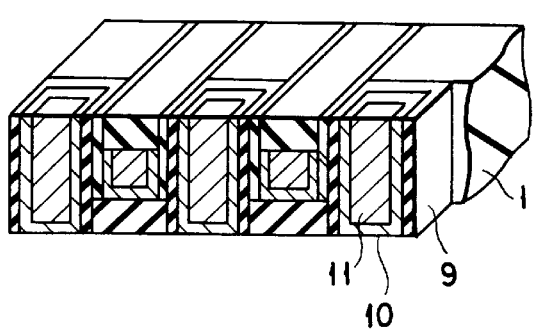

After this, as shown in FIG. 5F, a barrier metal film 10 and tungsten film 11 are sequentially deposited to fill the respective contact holes 8, and then the tungsten film 11 and barrier metal film 10 are polished by use of the CMP method until the silicon oxide film 1 and the silicon nitride film 6 are exposed and thus the upper surface of the structure is made flat.

With the above method, the contact holes 8 adjacent to the Damascene interconnections can be formed in self-alignment with the Damascene interconnections (tungsten films 4). Further, in this embodiment, an effect that the side walls 13 of high film quality can be formed can be obtained.

Next, a fourth embodiment of this invention is explained with reference to FIGS. 6 to 23. The fourth embodiment is applied to a manufacturing method for forming a bit line and a storage node contact of an STC type DRAM cell.

Figure 6:
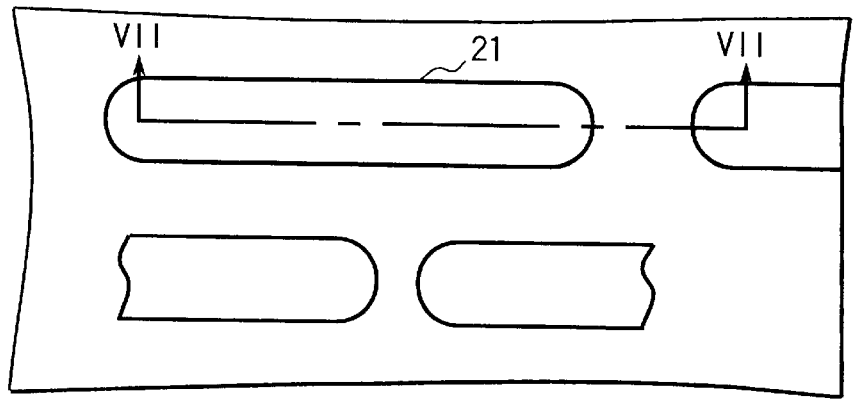
FIG. 6 is a view showing a mask used in a manufacturing method for manufacturing a semiconductor device according to a fourth embodiment of this invention.
Figure 7:
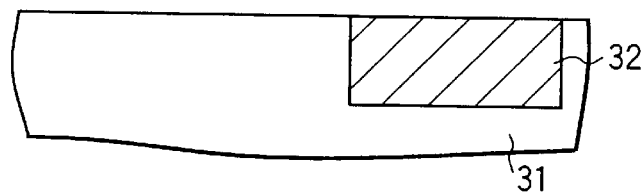
FIG. 7 is a cross sectional view showing a semiconductor device formed by use of the mask of FIG. 6.

First, an element isolation film 32 is formed on the surface of a P-type silicon semiconductor substrate 31 as shown in FIG. 7 by use of an active region pattern 21 shown in FIG. 6 by the known STI (Shallow Trench Isolation) method.

Figure 8:
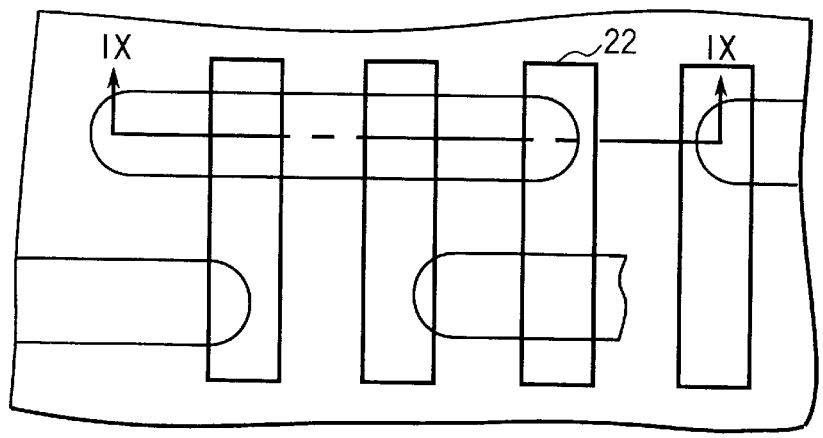
FIG. 8 is a view showing a mask used in the manufacturing method for manufacturing the semiconductor device according to the fourth embodiment of this invention.
Figure 9:
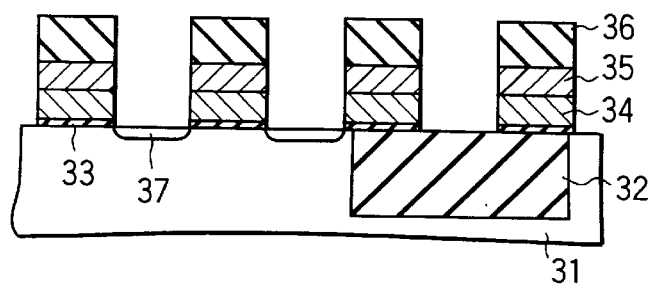
FIG. 9 is a cross sectional view showing a semiconductor device formed by use of the mask of FIG. 8.

After a gate oxide film 33 is formed on the surface of the semiconductor substrate 31, a polysilicon film 34, tungsten silicide film 35 and silicon nitride film 36 are sequentially formed and then gate electrodes are patterned by use of a gate electrode pattern 22 shown in FIG. 8. Next, N-type impurity is ion-implanted by using the gate electrodes as a mask to form source/drain diffusion regions 37 as shown in FIG. 9.

Figure 10:
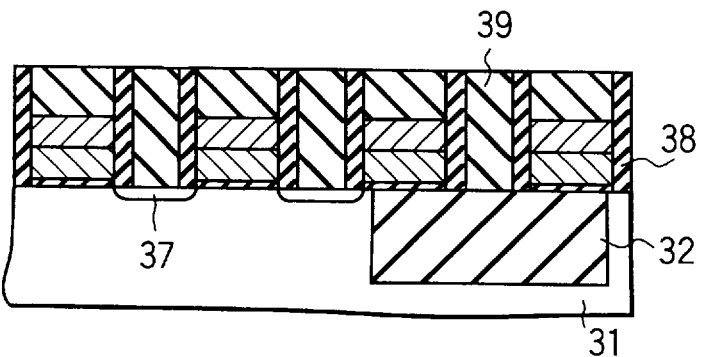
FIG. 10 is a cross sectional view showing a semiconductor device in a step following the step of FIG. 9.

Next, as shown in FIG. 10, silicon nitride films 38 are formed on the side walls of the gate electrodes, then a silicon oxide film 39 is formed on the entire surface and the surface is made flat by polishing the silicon oxide film 39 by use of the CMP method until the silicon nitride film 36 is exposed.

Figure 11:
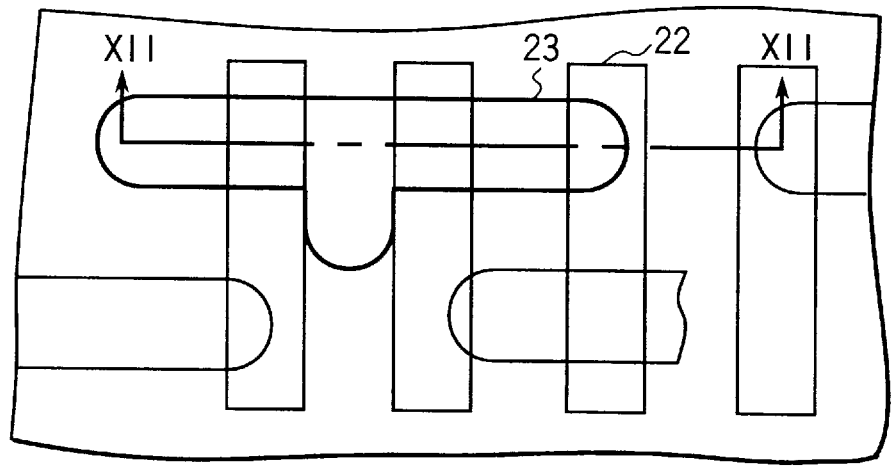
FIG. 11 is a view showing a mask used in the manufacturing method for manufacturing the semiconductor device according to the fourth embodiment of this invention.
Figure 12:
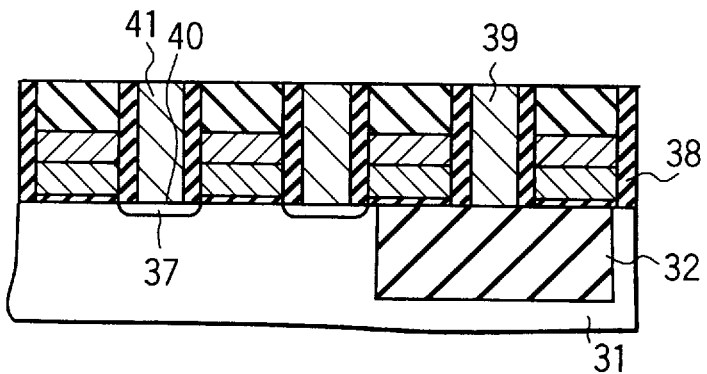
FIG. 12 is a cross sectional view showing a semiconductor device formed by use of the mask of FIG. 11.

After this, the silicon oxide film 39 is etched by using a poly-plug pattern 23 shown in FIG. 11 under a condition that the selective etching ratio for the silicon nitride films 36, 38 is set high so that contact holes 40 can be formed in self-alignment with the gate electrodes as shown in FIG. 12. Then, a polysilicon film 41 is formed on the entire surface to completely fill the contact holes 40 and the polysilicon film 41 is polished to make the surface of the structure flat by use of the CMP method until the silicon nitride film 36 and silicon oxide film 39 are exposed.

Figure 13:
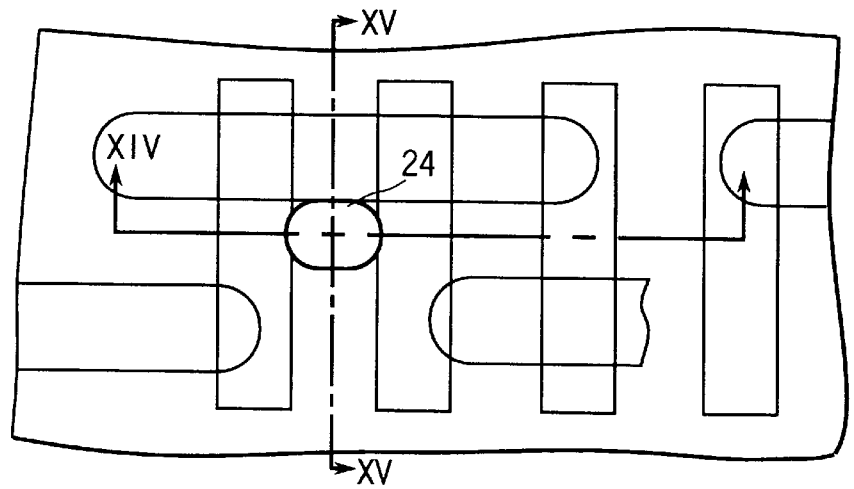
FIG. 13 is a view showing a mask used in the manufacturing method for manufacturing the semiconductor device according to the fourth embodiment of this invention.
Figure 14:
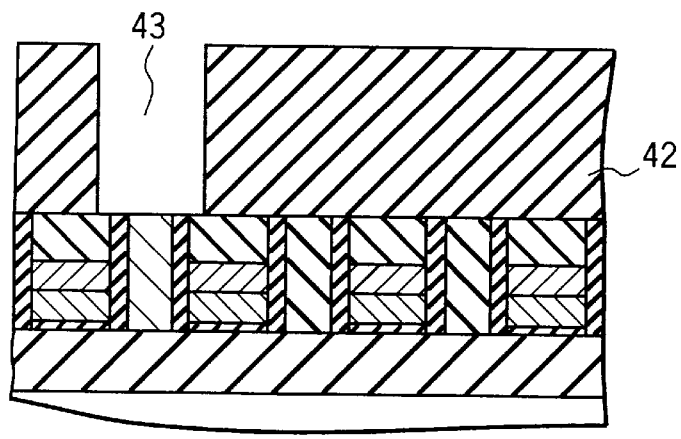
FIG. 14 is a cross sectional view showing a semiconductor device formed by use of the mask of FIG. 13.
Figure 15:
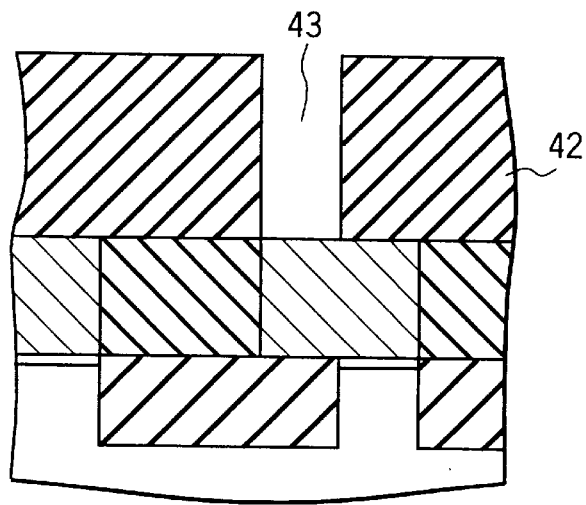
FIG. 15 is a cross sectional view showing a semiconductor device formed by use of a mask of FIG. 13.

Next, a silicon oxide film 42 is formed on the entire surface and a contact hole 43 is formed as shown in FIGS. 14 and 15 by using a bit line contact pattern 24 shown in FIG. 13.

Figure 16:
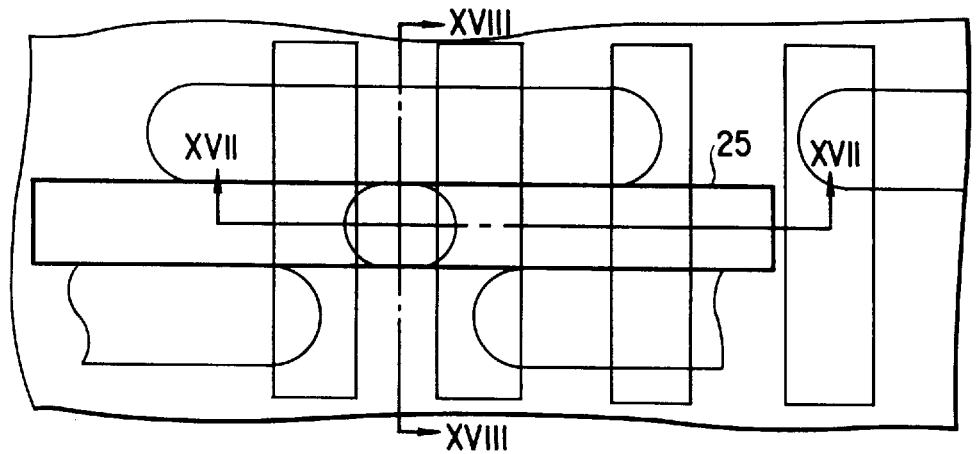
FIG. 16 is a view showing a mask used in the manufacturing method for manufacturing the semiconductor device according to the fourth embodiment of this invention.
Figure 17:
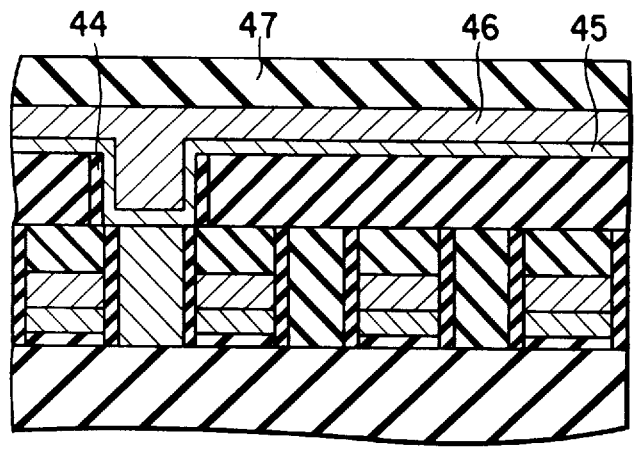
FIG. 17 is a cross sectional view showing a semiconductor device formed by use of the mask of FIG. 16.
Figure 18:
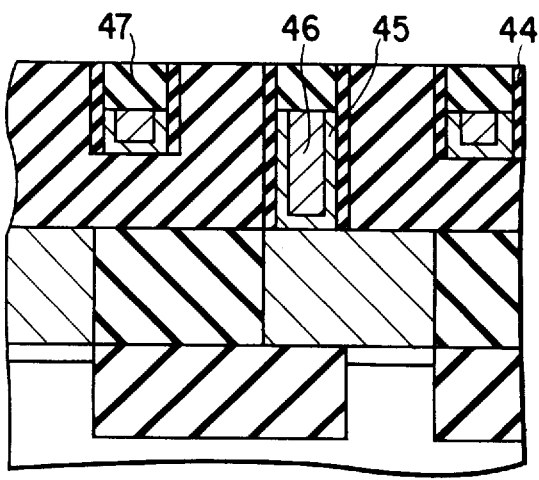
FIG. 18 is a cross sectional view showing a semiconductor device formed by use of the mask of FIG. 16.

Next, trenches are formed in the silicon oxide film 42 by the known Damascene method using a bit line pattern 25 shown in FIG. 16, then a silicon nitride film 44 is formed with such a film thickness as not to completely fill the trenches as shown in FIGS. 17 and 18 and the entire surface portion is etched back by use of the RIE method to form side walls of the silicon nitride film 44 on the side walls of the trenches. After this, a barrier metal film 45 and tungsten film 46 are formed to fill the trenches. Then, the barrier metal film 45 and tungsten film 46 are polished by use of the CMP method until the silicon oxide film 42 is exposed and thus the surface of the structure is made flat and bit lines formed of the tungsten film 46 are formed. After this, the tungsten film 46 and barrier metal film 45 are etched to some extent by use of the RIE method to form stepped portions which are the same as those explained in the first to third embodiments. Then, a silicon nitride film 47 is formed to fill the stepped portions and the silicon nitride film 47 is polished to make the surface of the structure flat by use of the CMP method until the silicon oxide film 42 is exposed.

Figure 19:
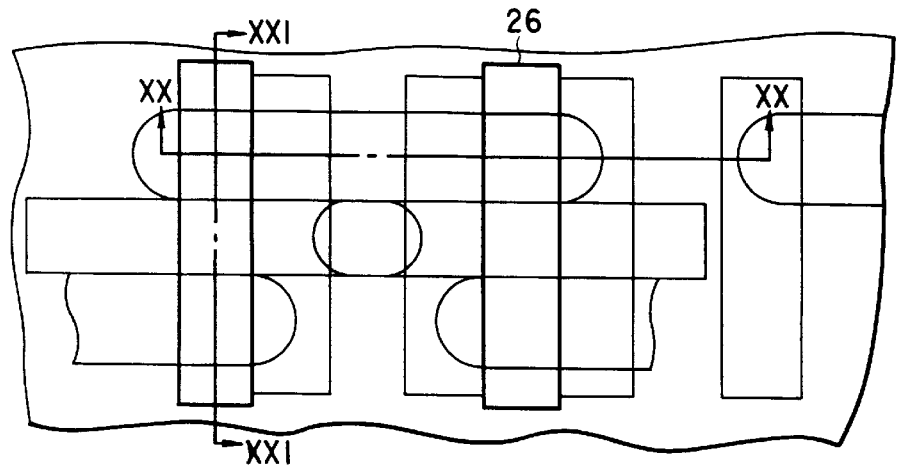
FIG. 19 is a view showing a mask used in the manufacturing method for manufacturing the semiconductor device according to the fourth embodiment of this invention.
Figure 20:
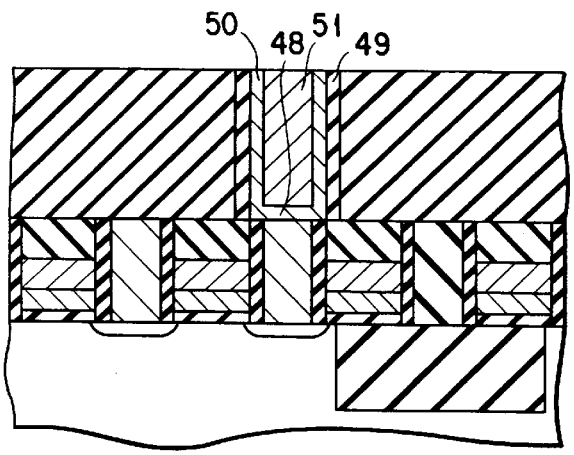
FIG. 20 is a cross sectional view showing a semiconductor device formed by use of the mask of FIG. 19.
Figure 21:
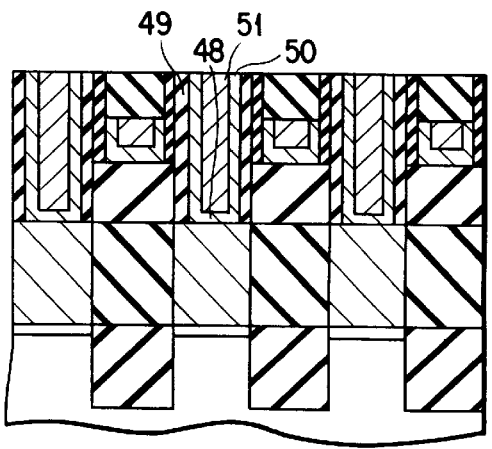
FIG. 21 is a cross sectional view showing a semiconductor device formed by use of the mask of FIG. 19.

Next, the silicon oxide film 42 is etched by use of the RIE method using a storage node contact pattern 26 shown in FIG. 19 under a condition that the selective etching ratio for the silicon nitride film 47 is set high, and as a result, a contact hole 48 is formed as shown in FIGS. 20 and 21. Then, a silicon nitride film 49 is formed, and the entire surface portion is etched back by use of the RIE method to form side walls of the silicon nitride film 49 on the side walls of the contact hole 48. After this, a barrier metal film 50 and tungsten film 51 are sequentially formed to fill the contact hole 48. Then, the tungsten film 51 and barrier metal film 50 are polished by use of the CMP method to make the upper surface of the structure flat until the silicon oxide film 42 and silicon nitride film 47 are exposed.

Figure 22:
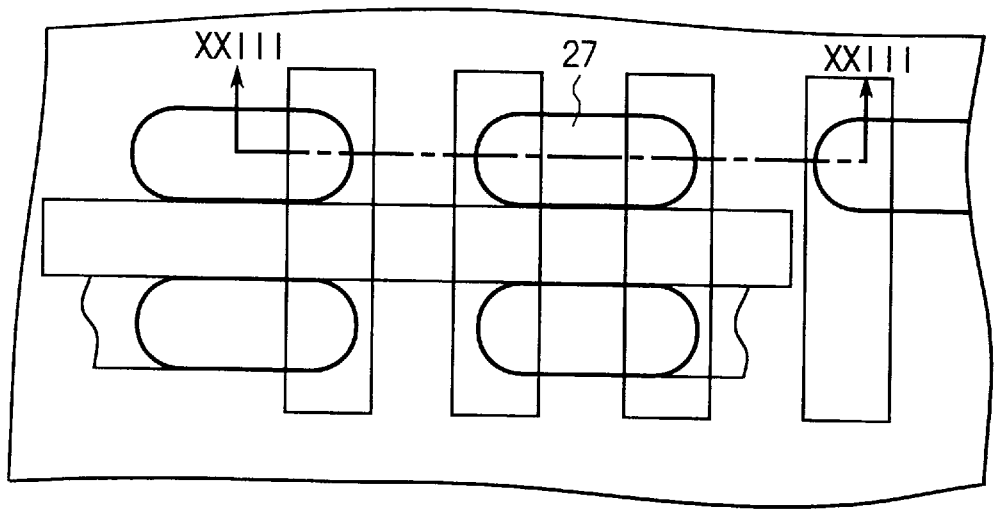
FIG. 22 is a view showing a mask used in the manufacturing method for manufacturing the semiconductor device according to the fourth embodiment of this invention.
Figure 23:
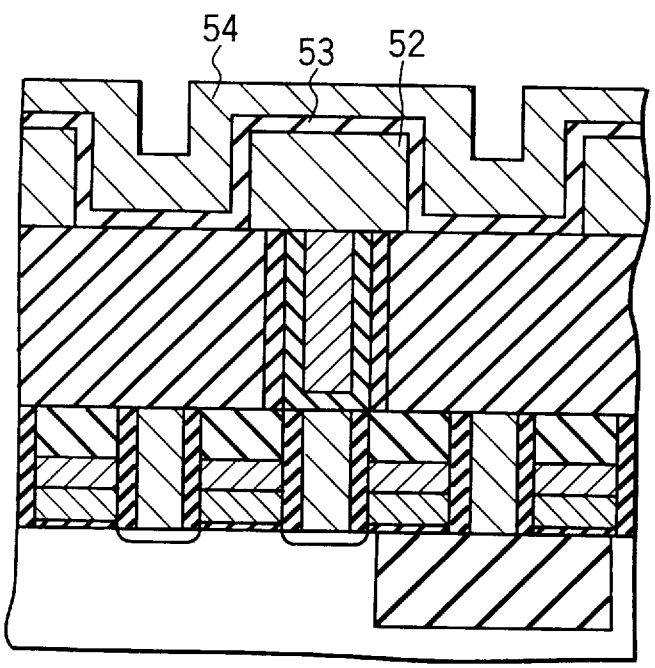
FIG. 23 is a cross sectional view showing a semiconductor device formed by use of the mask of FIG. 19.

Next, a ruthenium film 52 used as the lower electrode of a capacitor is formed by the sputtering method, a storage node electrode formed of the ruthenium film 52 is formed as shown in FIG. 23 by using a storage node pattern 27 shown in FIG. 22, and a BSTO (Barium Strontium Titanium Oxide) film 53 which is used as the capacitor insulating film and a ruthenium film 54 which is used as the upper electrode are formed to construct the memory capacitor. After this, interconnections are formed by the known method to complete a DRAM.

With the DRAM manufactured by the above method, bit line contacts and bit lines can be realized in a borderless manner and the storage node contacts and bit lines can be formed in a self-aligned manner, thereby making it possible to reduce the size and extremely lowering the unit cost for each bit of the memory cell.

In the fourth embodiment, a case wherein the lower electrode and upper electrode of the capacitor are formed by using ruthenium films is explained, but it is possible to use platinum films instead of the ruthenium films.

As explained above, according to this invention, it is possible to provide a semiconductor device having contact holes which can be formed in self-alignment with bit lines and a method for manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:

a first insulating film formed on a semiconductor substrate;

trenches formed in said first insulating film;

first conductive films formed on bottom surfaces of said trenches and extending to a first preset depth on side wall surfaces of said trenches, and formed to such a thickness that said trenches are not completely filled;

second conductive films formed on said first conductive films to fill said trenches to a second preset depth; and second insulating films formed on said first and second conductive films to completely fill said trenches.

2. A semiconductor device according to claim 1, wherein each of said second conductive films is formed of refractory metal.

3. A semiconductor device according to claim 1, wherein each of said first conductive films is formed of barrier metal.

4. A semiconductor device according to claim 1, further comprising spacers formed of a third insulating film on the side walls of said trenches.

5. A semiconductor device comprising:

a first insulating film formed on a semiconductor substrate;

trenches formed in said first insulating film;

first conductive films formed on bottom surfaces of said trenches and on side wall surfaces of said trenches except for upper portions of the side walls and formed to such a thickness as to partly fill said trenches;

second conductive films formed on said first conductive films to such a thickness that an upper surface of said second conductive films is set at a higher position than an upper surface of said first conductive films formed on the side walls of said trenches; and second insulating films formed to completely fill said trenches.

6. A semiconductor device according to claim 5, wherein each of said second conductive films is formed of refractory metal.

7. A semiconductor device according to claim 5, wherein each of said first conductive films is formed of barrier metal.

8. A semiconductor device according to any one of claims 5 to 7, wherein said first insulating film is formed of silicon oxide and said second insulating film is formed of silicon nitride.

9. A semiconductor device comprising:

a first insulating film formed on a semiconductor substrate;

first and second trenches separately formed in said first insulating film;

contact holes formed in an area of said first insulating film disposed between said first and second trenches;

first spacers formed of a second insulating film on side walls of said first and second trenches;

first conductive films formed on bottom surfaces of said first and second trenches and extending to a first preset depth on said first spacers formed on the side walls of said first and second trenches, and formed to such a thickness that said trenches are not completely filled;

second conductive films formed on said first conductive films to fill said trenches to a second preset depth;

third insulating films formed on said first and second conductive films to completely fill said trenches;

second spacers formed of a fourth insulating film on side walls of said contact holes;

third conductive films formed on the second spacers and formed on bottom surfaces of said contact holes to such a thickness that said contact holes are not completely filled; and fourth conductive films formed on said third conductive films to completely fill said contact holes.

10. A semiconductor device according to claim 9, wherein each of said first and third conductive films are formed of barrier metal.

11. A semiconductor memory device comprising:

an element isolation insulating film formed on a semiconductor substrate;

MOSFETs having gate electrodes formed over said semiconductor substrate with gate insulating films disposed therebetween and source and drain diffusion regions formed in said semiconductor substrate;

a first insulating film formed to cover said MOSFETs;

trenches for forming bit lines and bit line contact holes formed in said first insulating film;

bit lines which are formed of first conductive films formed to partly fill said trenches and which are each electrically connected to one of source and drain diffusion regions of a corresponding one of said MOSFETs;

second insulating films formed to completely fill said trenches;

storage node contact holes formed in said first insulating film in positions adjacent to said bit lines;

spacers formed of a third insulating film on the side walls of said storage node contact holes;

second conductive films formed to fill said storage node contact holes; and capacitors which include storage electrodes, capacitor insulating films and plate electrodes and which are each electrically connected to the other of the source and drain diffusion regions of a corresponding one of said MOSFETs.

12. A semiconductor memory device comprising:

a first conductive film for forming a first interconnection;

contact holes formed adjacent to said first interconnection and used for connecting upper-level ones of second interconnections to lower-level ones of third interconnections;

a second conductive film formed to fill said contact holes; and spacers formed between said first and second conductive films, for electrically isolating said first and second conductive films from each other, a film thickness of those of said spacers which lie above said first interconnection being larger than the film thickness of those of said spacers which lie below said first interconnection.

* * * * *